United States Patent [19]

Bloem et al.

[11] Patent Number: 4,891,332

[45] Date of Patent: Jan. 2, 1990

[54] METHOD OF MANUFACTURING A SEMICONDUCTOR DEVICE COMPRISING A CIRCUIT ELEMENT FORMED OF CARBON DOPED POLYCRYSTALLINE SILICON

[75] Inventors: Jan Bloem; Wilhelmus A. P. Claassen, both of Eindhoven, Netherlands

[73] Assignee: U.S. Philips Corporation, New York, N.Y.

[21] Appl. No.: 851,904

[22] Filed: Apr. 11, 1986

Related U.S. Application Data

[60] Division of Ser. No. 664,635, Oct. 25, 1984, abandoned, Continuation of Ser. No. 396,921, Jul. 9, 1982, abandoned.

[30] Foreign Application Priority Data

Aug. 3, 1981 [NL] Netherlands .......................... 8103649

[51] Int. Cl.$^4$ .......................................... H01L 21/223
[52] U.S. Cl. ....................................... 437/165; 437/24; 437/967
[58] Field of Search ............. 148/DIG. 40, DIG. 136; 427/39; 437/162, 163, 24, 165, 233, 967

[56] References Cited

U.S. PATENT DOCUMENTS

| | | | |
|---|---|---|---|
| 3,497,773 | 2/1973 | Kisinko et al. | 357/51 |
| 3,750,268 | 8/1973 | Wang | 357/59 |
| 4,004,950 | 1/1977 | Baruch et al. | 148/1.5 |
| 4,189,826 | 2/1980 | Smith | 357/24 |
| 4,329,699 | 5/1982 | Ishihara et al. | 357/2 |
| 4,362,766 | 12/1982 | Dannhauser et al. | 427/39 |
| 4,403,239 | 9/1983 | Yamazaki | 357/30 |
| 4,439,463 | 3/1984 | Miller | 427/39 |
| 4,523,369 | 6/1985 | Nagakubo | 29/576 W |

OTHER PUBLICATIONS

Bloem et al., Appl. Phys. Lett. 40 (Apr. 1982), pp. 725-726.
Claassen et al., J. Electrochem. Soc.: Solid-State Science and Technology, 130 (Jul. 1983), pp. 1586-1592.

*Primary Examiner*—Olik Chaudhuri
*Attorney, Agent, or Firm*—Norman N. Spain

[57] ABSTRACT

The invention relates to a semiconductor device having a semiconductor body which comprises a circuit element having doped polycrystalline silicon.

The doping comprises carbon in a concentration higher than 1 ppm. Polysilicon thus doped has properties which are not influenced by temperature treatments of the semiconductor body. Dopant is gaseous unsaturated hydrocarbon, e.g. acetylene.

2 Claims, 1 Drawing Sheet

METHOD OF MANUFACTURING A SEMICONDUCTOR DEVICE COMPRISING A CIRCUIT ELEMENT FORMED OF CARBON DOPED POLYCRYSTALLINE SILICON

This is a division of application Ser. No. 664,635, filed Oct. 25, 1984, and now abandoned, said application Ser. No. 664,635 being a continuation of application Ser. No. 396,921, filed July 9, 1982 and now abandoned.

BACKGROUND OF THE INVENTION

The invention relates to a semiconductor device having a semiconductor body which comprises a circuit element with a part formed from doped polycrystalline silicon.

The term semiconductor device includes, for example, diodes, transistors and integrated circuits.

Polycrystalline silicon is silicon in which crystallites can be demonstrated by X-ray analysis. The size of said crystallites is at least approximately 15 Å.

The presence of grain limits in polycrystalline silicon means that, electrically, this material is inhomogeneous, while amorphous and monocrystalline silicon –in the absence of grain limits–are homogeneous materials, electrically.

In semiconductor devices, polycrystalline silicon is used for many purposes, for example, as a diffusion source on a semiconductor body, as a conductive material, for example, for gate electrodes in MOS transistors, and as a resistive material.

In all these applications the polycrystalline silicon may comprise a dopant influencing the electric conductivity, which dopant as such determines the electric conductivity in the polycrystalline silicon and/or can be transferred to a semiconductor body.

A problem with polycrystalline silicon is that treatments at elevated temperatures, as are usual upon tempering and diffusion, for example, may give rise to reduced stability and poorer reproducibility of the semiconductor device.

For example, crystal growth easily occurs in polycrystalline silicon when the temperature rises. When the crystal size becomes of the order of magnitude of the thickness of a polycrystalline layer, a substrate on which the layer is present can be undesirably attacked upon etching.

SUMMARY OF THE INVENTION

One of the objects of the invention is to avoid the above problems at least to a considerable extent.

The invention is inter alia based on the recognition of the fact that the properties of polycrystalline silicon can be improved by the incorporation of certain substances.

Therefore, according to the invention, the semiconductor device mentioned in the opening paragraph is characterized in that the polycrystalline silicon is doped with carbon in a concentration which is higher than 1 part per million (ppm.).

In this concentration range of the carbon the properties of polycrystalline silicon are stable and reproducible and the grain size of the polycrystalline silicon remains substantially constant independently of treatments at temperatures which are usual in the manufacture of semiconductor devices.

It is to be noted that in growing monocrystalline silicon it is endeavoured to keep the carbon content as low as possible, preferably lower than 1 ppm $10^{-4}$ per cent by weight), because it is difficult to grow monocrystalline material at a higher carbon content.

It is known to add carbon to amorphous silicon so as to prevent crystallites developing in this material by treatments at elevated temperature. Comparatively large amounts of carbon are used, namely up to approximately 20 per cent by weight.

The conductivity of the polycrystalline silicon doped with carbon can further be adjusted particularly suitably if the polycrystalline silicon is further doped with a dopant determining the conductivity type.

It has been found that at low concentrations of, for example, phosphorus and with comparatively low carbon concentrations, both the electric resistance and the activation energy of the electric resistance of the polycrystalline silicon decrease when the carbon concentration increases. With these small concentrations the carbon atoms are probably present at the boundaries of the silicon crystallites and increase the mobility of the charge carriers over the grain limits. At higher phosphorus concentrations the influence of small carbon concentrations on the resistance is small.

When the carbon concentration in the polycrystalline silicon is further increased, both the resistance and the activation energy of the resistance increase at all phosphorus concentrations. This is associated with the presence of silicon carbide and/or carbon as the second phase beside the polycrystalline silicon. In forming polycrystalline silicon with such a carbon content and such properties the grains are generally smaller than at lower carbon content.

When the carbon concentration is still further increased, the resistance and the activation energy of the resistance decrease again. The comparatively low resistance is possibly associated with conductivity via carbon bridges. The silicon, in particular when low formation temperatures are used, has then become substantially amorphous.

The polycrystalline silicon in the semiconductor device according to the invention may form the gate electrode of MOS transistor or the polycrystalline silicon locally forms a resistor on the semiconductor body.

The polycrystalline silicon may form a resistance layer for the draining of charge on a p-n junction, for example, in a high-voltage transistor.

The invention furthermore relates to a method of manufacturing a semiconductor device according to the invention.

For that purpose, for example, carbon may be implanted in a provided polycrystalline silicon layer. In order to obtain a homogeneous distribution of carbon through the silicon, the voltage upon implantation must continually be varied in the course of the process so as to adjust the desired carbon concentration in any place in the silicon. As a matter of fact, a temperature treatment cannot improve the homogeneity of the carbon distribution, since carbon diffuses very slowly into silicon even at elevated temperatures.

In manufacturing a semiconductor device in accordance with the invention the doped polycrystalline silicon is preferably formed from a gaseous silicon compound and a gaseous unsaturated carbon compound at a temperature above 700° C.

Acetylene is very suitable for incorporation of carbon in the polycrystalline silicon.

In manufacturing the semiconductor device the polycrystalline silicon may be used as a diffusion source to obtain a doped region in the semiconductor body.

DESCRIPTION OF THE PREFERRED EMBODIMENTS

Figure 1:
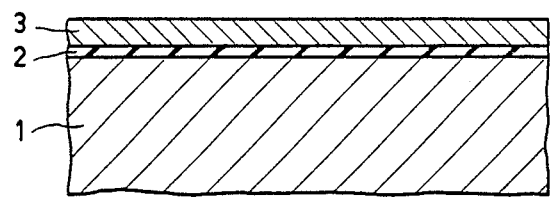
FIG. 1 and FIG. 2 are diagrammatic sectional views on a part of the semiconductor device of the invention in various stages of its manufacture by the method of the invention.
Figure 2:
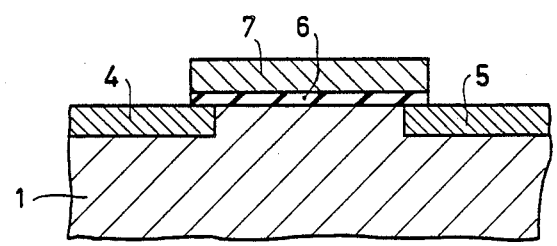

The invention will now be described in greater detail with reference to a few examples and the accompanying drawing. FIGS. 1 and 2 of the drawing are diagrammatic sectional views of a part of a semiconductor device in successive stages of the manufacture by means of the method according to the invention.

For eample, in the manufacture of a MOS transistor (see FIG. 1) a semiconductor body 1 of silicon is provided at a stage of the manufacture in a usual manner with a 0.2 $\mu$m thick layer 2 of silicon dioxide on which a 0.5 $\mu$um thick layer 3 of polycrystalline silicon is provided.

According to the invention the layer 3 is doped with carbon in a concentration above 1 ppm and it is formed from a gaseous silicon compound and a gaseous unsaturated carbon compound at a temperature above 700° C.

As a carbon compound there is used, for example, acetylene ($C_2H_2$). At a temperature of 850° C. and a concentration of $10^{-3}$% by volume of acetylene is hydrogen as a carrier gas, a carbon content in layer 3 is obtained of 1000 ppm ($5 \times 10^{19}$ at/cm$^3$) with a grain size of the silicon in layer 3 of 0.1 $\mu$m.

This grain size is substantially not varied in later process steps when source and drain regions 4 and 5 of the MOS transistor are obtained.

The polycrystalline silicon layer 3 may furthermore be doped with a dopant determining the conductivity type. The dopant may be present as gaseous $PH_3$ during the formation of layer 3. Said dopant may also be introduced in the already formed polycrystalline silicon by diffusion by means of a $POCl_3$ source or by ion implantation.

After the partial removal (see FIG. 2) of the layers 2 and 3, the gate insulation 6 and the gate electrode 7 thereof remain and the source region 4 and the drain region 5 are provided and the usual additional treatments to obtain the MOS transistor are carried out.

When a thermal treatment is used upon doping the polycrystalline silicon with a dopant determining the conductivity type, in the absence of carbon in the polycrystalline layer, a considerable enlargement of the crystals in said layer may occur and the crystals may become equal to or larger than the thickness of the layer.

As is usual, such a thermal treatment of the polycrystalline layer is carried out in an oxygen atmosphere, in which a silicon oxide layer is formed on the polycrystalline layer.

The gate electrode 7 is also used as a mask during the introduction of a dopant in the silicon body 1 so as to obtain the source and drain regions 4 and 5.

An oxide layer formed during said treatments may be removed from the gate electrode by etching. When the gate electrode has become coarse crystalline, the gate insulation below the gate electrode can also be attacked easily and short-circuit with the silicon body occurs during subsequent metallization of the gate electrode.

This problem does not occur in the semiconductor device and the method according to the invention. Herewith a polycrystalline silicon layer is formed the crystal size of which can be chosen to be sufficiently small. Said grain size remains constant and does not increase in subsequent thermal treatments.

Carbon-doped polycrystalline silicon layers may also be used as a resistor. They have the advantage over resistors in a monocrystalline semiconductor body that the area required for that purpose may then be used for other circuit elements.

A polycrystalline resistor is then provided on an insulating layer and, for example via apertures in said layer, contacts an underlying monocrystalline semiconductor body and/or, via apertures in an insulating layer present on the resistor, contacts a wiring pattern present above the resistor.

By doping the polycrystalline silicon with $10^{19}$ atoms C/cm$^3$ and a dopant determining the conductivity type, for example phosphorus, resistivities of the polycrystalline silicon between 1 and $10^5$ $\Omega$ cm may be adjusted.

In the absence of carbon in the polycrystalline silicon it is difficult to obtain stable resistance values in the said region. This is associated with the fact that the resistance then depends considerably on the crystal size.

In the presence of carbon the resistance has become little dependent on subsequent treatments at high temperatures. Both the value of the resistance and the temperature coefficient then are constant and reproducible.

By suitable choice of the dimensions of the resistor the desired resistance can be chosen within wide limits.

Carbon-doped polycrystalline silicon layers may also be used as a passivating layer on a p-n junction. For that purpose, in high voltage diodes and transistors a layer of high-ohmic material which also forms a controlled leakage path is often desirable. A 0.2 $\mu$m thick layer having a crystal size of 0.1 $\mu$m which has a resistivity of $10^{10}$ $\Omega/\square$ and comprises a silicon dioxide layer forms a suitable passivation for p-n junctions operated at high reverse voltage.

Carbon-doped polycrystalline silicon layers may be used as a diffusion source in order to obtain a doped region in a semiconductor body.

For this purpose, polycrystalline silicon layers, as described above in connection with the manufacture of gate electrodes and resistors, are often provided as conductor tracks on and as a diffusion source in apertures of a masking layer. After the diffusion treatment the diffusion source is maintained as a contact in the apertures on the semiconductor body.

The crystal size of the diffusion source is chosen to be small and remains constant during the diffusion treatment so that upon removing the oxide layer from the polysilicon an oxide layer, if any, present below the polysilicon is not attacked.

The invention is not restricted to the examples described which are meant as an illustration of the invention.

Suitable temperatures for providing the polycrystalline layer are normally between 700° and 1000° C. and the pressures used are generally between 65 and $10^5$ Pa.

A semiconductor body on which the polysilicon is provided may also consist, for example, of $A_{III}B_V$ material.

What is claimed is:

1. A method of manufacturing a semiconductor device having a semiconductor body comprising a circuit element formed of polycrystalline silicon doped with carbon in a concentration higher than 1 part per million, said method comprising forming said carbon doped polycrystalline silicon by heating a mixture of a gaseous silicon compound and a gaseous unsaturated hydrocarbon compound to a temperature above 700° C.

2. A method as claimed in claim 1, characterized in that the carbon compound is acetylene.

* * * * *